United States Patent [19]
Sugimoto et al.

[11] Patent Number: 6,107,675
[45] Date of Patent: Aug. 22, 2000

[54] LEAD FRAME

[75] Inventors: Hiroshi Sugimoto; Hiroki Tanaka; Shigeo Hagiya; Takaharu Yonemoto, all of Ibaraki, Japan

[73] Assignee: Hitachi Cable, Ltd., Tokyo, Japan

[21] Appl. No.: 08/873,704

[22] Filed: Jun. 12, 1997

[30] Foreign Application Priority Data

Jun. 12, 1996 [JP] Japan .................................. 8-151207
Aug. 2, 1996 [JP] Japan .................................. 8-204757

[51] Int. Cl.$^7$ .................................................. H01L 23/495
[52] U.S. Cl. .......................... 257/666; 257/676; 257/692
[58] Field of Search .................................. 257/666, 676, 257/692

[56] References Cited

U.S. PATENT DOCUMENTS 5,384,487  1/1995  Rostoker et al. ..................... 257/666
5,455,200  10/1995 Bigler et al. ......................... 257/666
5,872,398  2/1999  King et al. .......................... 257/735

FOREIGN PATENT DOCUMENTS 3-192736  8/1991  Japan .
4-75355   3/1992  Japan .

*Primary Examiner*—Roy Potter
*Attorney, Agent, or Firm*—McDermott, Will & Emery

[57] ABSTRACT

A lead frame for semiconductor device comprises first inner leads 21-2, 21-3 and 21-4 each having a region 22-2, 22-3, 22-4 on which a predetermined quantity of adhesive is applied, and second inner leads 21-1 and 21-5 each having a region 22-1, 22-5 which is wider than those of the first inner leads. The first inner leads 21-2, 21-3 and 21-4 have a width $W_1$, while the second inner leads 21-1 and 21-5 have a width $W_2$ which is wider than W1. The second inner leads 21-1 and 21-5 are arranged at the positions where one successive application of varnish-like adhesive to the inner leads begins and ends, respectively. The ratio of $W_1$ to $W_2$ is preferably 1 to 1.3 (i.e., $W_1:W_2=1:1.3$) or more. Even if an excessive quantity of varnish-like adhesive is applied to the beginning inner lead 21-1 or the ending inner lead 21-5, it is spread over the region 22-1 or 22-5, then adhesive layers having uniform thickness are formed.

22 Claims, 13 Drawing Sheets

LEAD FRAME

FIELD OF THE INVENTION

This invention relates to a lead frame, method of making the same, and a semiconductor device using the same, and more particularly to, a lead frame having a plurality of leads to which adhesives are applied so that a semiconductor chip is to be attached thereto, and a method of making the same and the semiconductor device using the same.

BACKGROUND OF THE INVENTION

For a conventional semiconductor device, such as DRAM (Dynamic Random Access Memory) of up to 1M bits, a package structure which comprises a lead frame having a plurality of inner leads, a semiconductor chip having contact pads thereon mounted on the inner leads, wherein contact pads are electrically connected to the corresponding inner leads by bonding wires, has been used. Nowadays, in accordance with a development of a semiconductor device of more expanded memory capacity, other package structures such as COL (Chip On Lead) for up to 4M bits and LOC (Lead On Chip) for up to 16M bits have been used.

A conventional lead frame used for a semiconductor device of LOC package structure comprises a plurality of leads each comprising an inner lead and an outer lead, and an insulating film stuck to the inner leads through which the inner leads are to be mounted on a semiconductor chip. The inner leads and the outer leads are fabricated by etching or pressing. The insulating film may be a resin film, such as polyimide film, on both surfaces of which an adhesive layer of thermoplastic resin or thermosetting resin is formed. The insulating film is punched in a predetermined shape by using a punch and a die, then stuck to the inner leads of the lead frame by heat and pressure.

For assembling a semiconductor device, a semiconductor chip is properly positioned against the lead frame thus formed, then attached to the insulating film by heat and pressure. Next, the inner leads and their corresponding contact pads are electrically connected by bonding wires using a bonding tool, respectively. Finally, the inner leads and the semiconductor chip are covered by a molding resin to expose the outer leads of the lead frame from the molding resin.

According to the conventional lead frame and the conventional semiconductor device, however, there is a disadvantage in that it costs high. For one thing, a variety of punches, dies and sticking machine must be prepared and used for obtaining a variety of lead frames. For another, the insulating film itself is expensive and remaining portion thereof created by punching a particular shape of insulating film is useless and must be wasted.

On the other hand, in stead of using an insulating film, a lead frame having inner leads to which only a varnish-like adhesive is applied to form an adhesive layer thereon, have been proposed. The varnish-like adhesive is made of thermoplastic resin or thermosetting resin dissolved in a solvent, and a predetermined quantity of the varnish-like adhesive is applied to each inner lead with a dispenser or by using screen printing technique. After the application of the varnish-like adhesive finishes, the solvent therein is evaporated at a predetermined temperature for a predetermined duration.

According to the second conventional lead frame, there are advantages set out below:

(a) a minimum and necessary quantity of varnish-like adhesive is able to be applied to only a necessary region of each lead. Therefore, not only an expensive materials and tools, such as polyimide film, specific punches and dies, are not necessary, but also residues of such film are no longer created. As a result, the cost of the lead frame becomes low.

(b) a material such as polyimide film is eliminated, and the total amount of high molecule materials to be contained in a semiconductor package is reduced. This makes the package reduce a quantity of moisture which may be absorbed, and makes it less likely to create a crack in the package due to solder reflow.

According to the second conventional lead frame, however, there is disadvantage in that the adhesive layers formed on the leads become nonuniform, which may cause a defect in mounting a semiconductor chip and wire bonding, and make it difficult to obtain a thinner semiconductor package.

For example, when an application of varnish-like adhesive to one of leads begins, the quantity of adhesive dispensed from a needle of the dispenser tends to be unstable, typically more than a predetermined normal quantity to be applied thereto. This is because an undesirable drop of adhesive may be created before the application begins, and a time lag of the dispensation may exist due to a delayed response to the air pressure added to the dispenser. A similar phenomenon may be observed for an adhesive layer formed on the lead where the application ends, because the quantity of the varnish-like adhesive may also become unstable, typically more than the predetermined normal quantity, due to an inertial effect of the adhesive. Such applications of unstable quantities of adhesives to the leads make the adhesive layers on the leads nonuniform.

SUMMARY OF THE INVENTION

Accordingly, it is an object of the invention to provide a lead frame for a semiconductor device in which adhesive layers having uniform thickness can be formed on leads.

It is a further object of the invention to provide a lead frame for a semiconductor device to which a semiconductor chip may be attached more securely.

It is a still further object of the invention to provide a lead frame for a semiconductor device which is suitable for secure wire bonding.

It is a still further object of the invention to provide a semiconductor device which may be thinner and more reliable.

It is a still further object of the invention to provide a method of making a lead frame of such kind.

According to the first feature of the invention, a lead frame for a semiconductor device, the lead frame having a plurality of leads, each lead having a region on which an adhesive is applied so that a semiconductor chip is to be attached to the lead with the adhesives, the leads comprise:

a plurality of first leads having a region on which a predetermined quantity of adhesive is applied successively; and a second lead having a region on which an unstable quantity of adhesive is received.

According to the second feature of the invention, A lead frame for a semiconductor device, the lead frame having a plurality of leads, each lead having a region on which an adhesive is applied so that a semiconductor chip is to be attached to the leads with the adhesives, the leads comprise:

a plurality of first inner leads having a region on which a predetermined quantity of adhesive is applied successively; and a second lead having a region which is wider than that of the first inner leads so that an unstable quantity of adhesive is received thereon.

According to the third feature of the invention, a semiconductor device, comprises:

a lead frame comprising a plurality of leads, each lead having a region on which a predetermined quantity of adhesive is applied successively, and means for receiving an unstable amount of adhesive;

a semiconductor chip having a plurality of contact pads, each lead of the lead frame being attached to the semiconductor chip with the adhesive, the plurality of contact pads being electrically connected to corresponding leads, respectively; and a sealing resin for covering the regions of the leads, the receiving means, and the semiconductor chip.

According to the fourth feature of the invention, a method of making a lead frame for a semiconductor device, the lead frame having a plurality of leads, each said lead having a region on which an adhesive is applied successively so that a semiconductor chip is to be attached to the leads with the adhesives, the leads comprising a plurality of inner leads to which a predetermined quantity of adhesive is applied, and means for receiving an unstable amount of adhesive, the receiving means comprising a first receiving means and a second receiving means which are provided at positions where the application of the adhesive begins and ends, respectively, the method comprises the steps of:dispensing adhesive toward the first receiving means, the inner leads and the second receiving means continuously as the dispenser relatively moves across the first receiving means, the inner leads and the second receiving means successively;

receiving an initial dispense of the adhesive by the first receiving means;

applying a predetermined quantity of the adhesive on the region of each lead, successively; and receiving the last dispense of the adhesive by the second receiving means.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a lead frame for a semiconductor device in the first preferred embodiment, the aforementioned conventional lead frame and a method of making the same will be explained.

Figure 1:
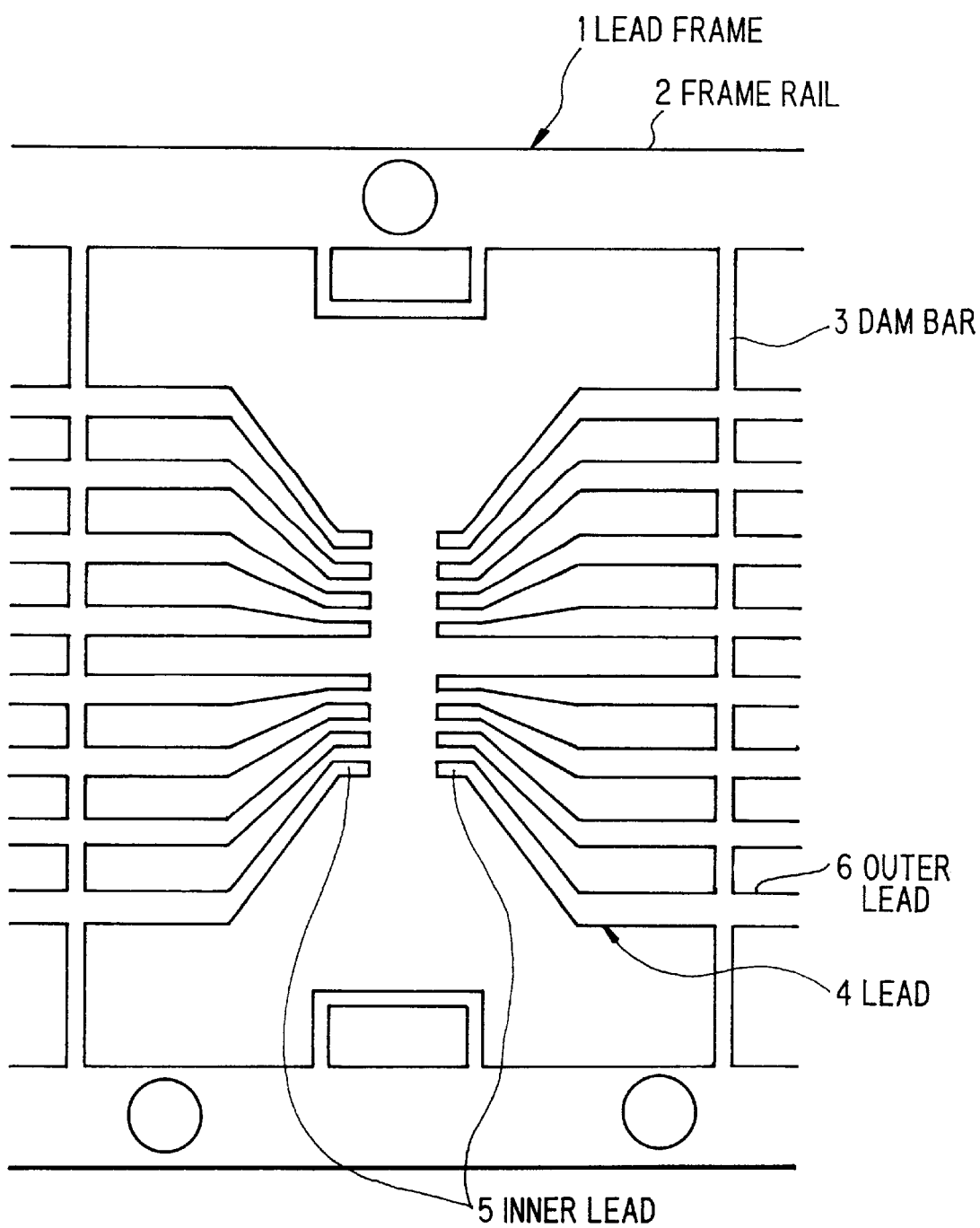
FIG. 1 is a plane view showing a first conventional lead frame.

FIG. 1 shows the first conventional lead frame for a semiconductor device. The lead frame 1 used for a semiconductor device of LOC package structure comprises a pair of frame rails 2 extending in parallel, a pair of dam bars 3 joining both frame rails 2, a plurality of leads 4 each comprising an inner lead 5 and an outer lead 6, which extend from each dam bar toward the center of the frame rail 2 to oppose to each other.

Figure 2:
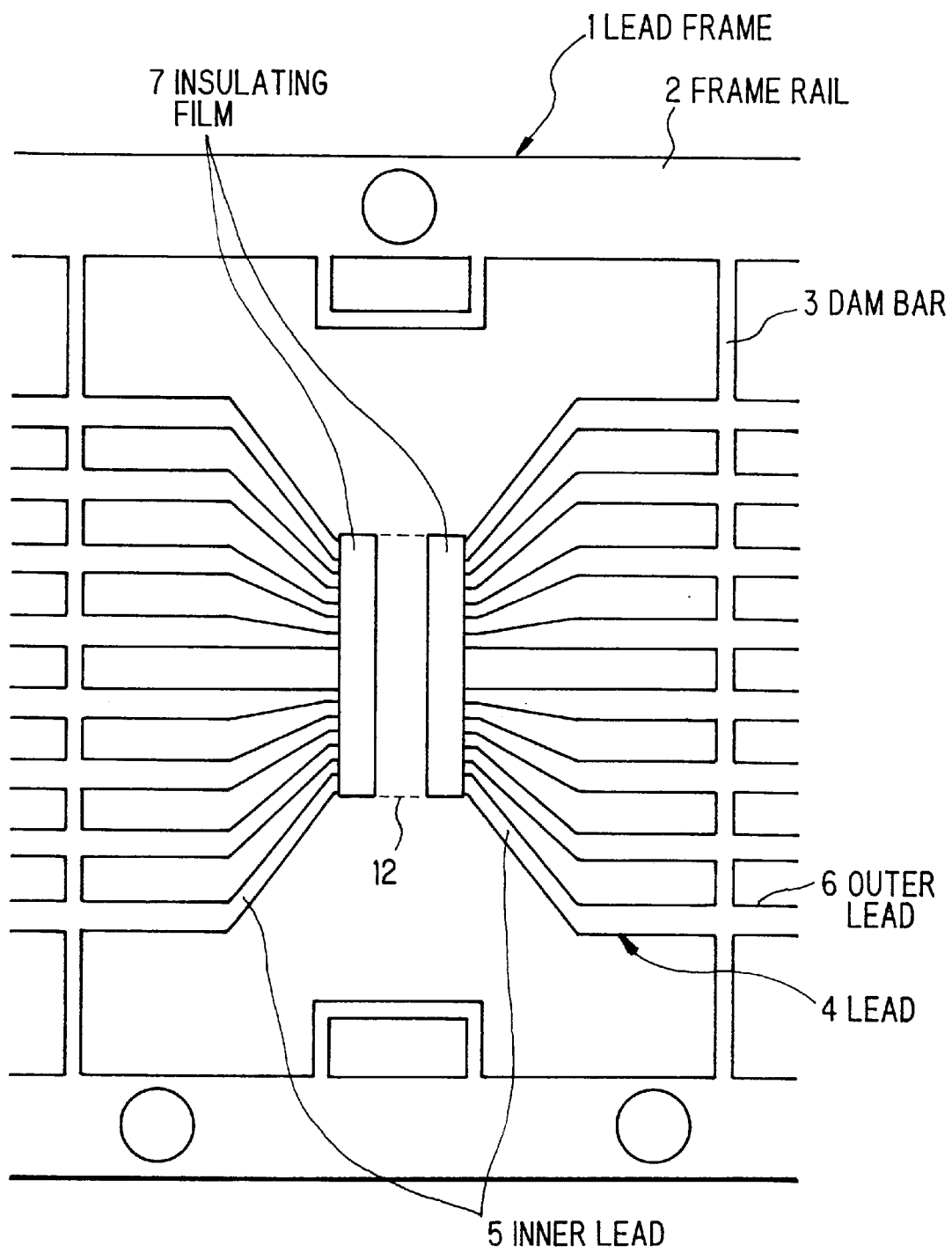
FIG. 2 is a view similar to FIG. 1, but showing a conventional lead frame, to inner leads of which a pair of adhesive tapes are stuck.

FIG. 2 shows the conventional lead frame to which insulating films are stuck, wherein like parts are indicated by like reference numerals as used in FIG.1. A pair of strips of insulating films 7 are stuck to the inner leads 5 to the extent where a semiconductor chip (not shown) is attached (as indicated by a broken line 12). In this example, the inner leads 5 are mounted on a semiconductor chip (not shown) through the insulating films 7. The inner leads 5 and the outer leads 6 are fabricated by etching or pressing. The insulating film 7 may be a resin film, such as polyimide film, on both surface of which an adhesive layer of thermoplastic resin or thermosetting resin is formed. The insulating film 7 is punched in a predetermined shape with a punch and a die (not shown), then stuck to the inner leads 5 of the lead frame 1 by heat and pressure.

Figure 3:
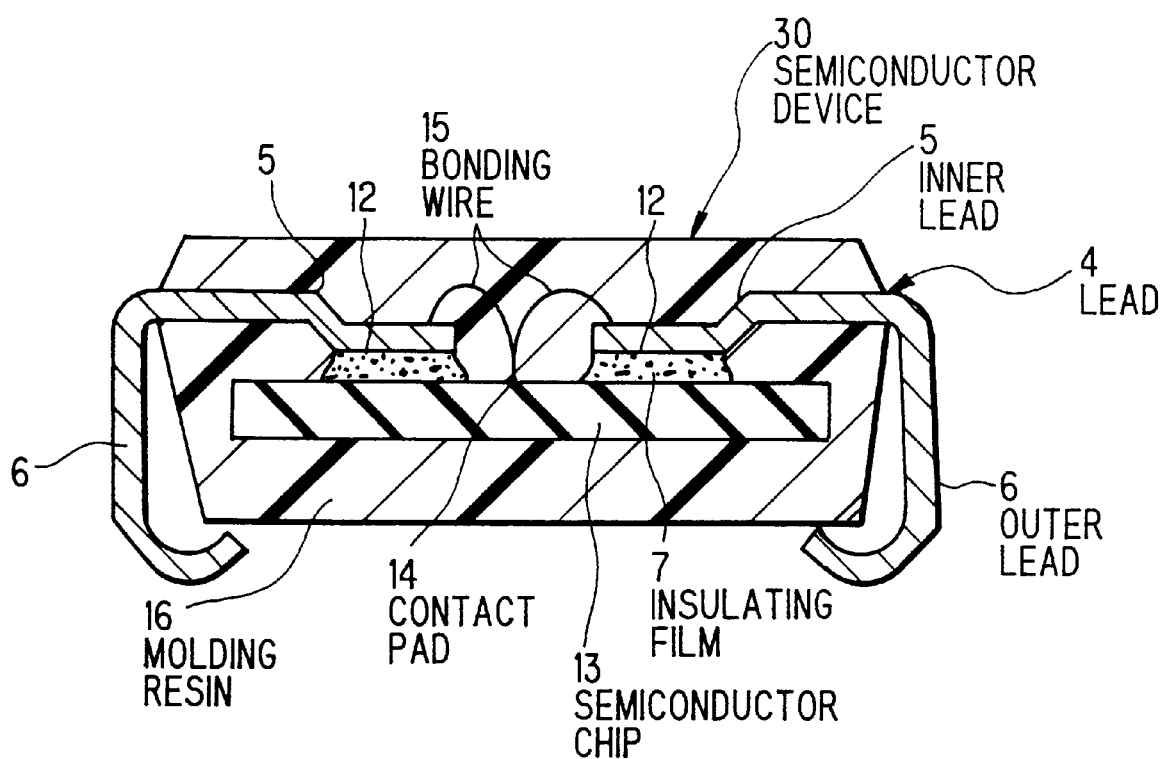
FIG. 3 is a cross-sectional view showing a conventional semiconductor device having a LOC package structure.

FIG. 3 show a conventional semiconductor device, wherein like parts are indicated by like reference numerals as used in FIGS. 1 and 2. For assembling the semiconductor device 30, a semiconductor chip 13 having a plurality of contact pads 14 thereon is properly positioned against the lead frame 1 thus formed, then stuck to the insulating film 7 by heat and pressure. Next, the inner leads 5 and the corresponding contact pads 14 on the semiconductor chip 13 are electrically connected by bonding wires 15 using a bonding tool (not shown), respectively. Finally, the inner leads 5, the semiconductor chip 13, and the bonding wires 15 are covered by a molding resin 16 to expose the outer leads 6 which extend in J-shape toward the backside of the semiconductor device 30.

According to the conventional lead frame and the conventional semiconductor device, however, there is a disadvantage in that they cost high, as explained before.

To overcome such shortcomings, a second conventional lead frame for a semiconductor device has been proposed.

Figure 4:
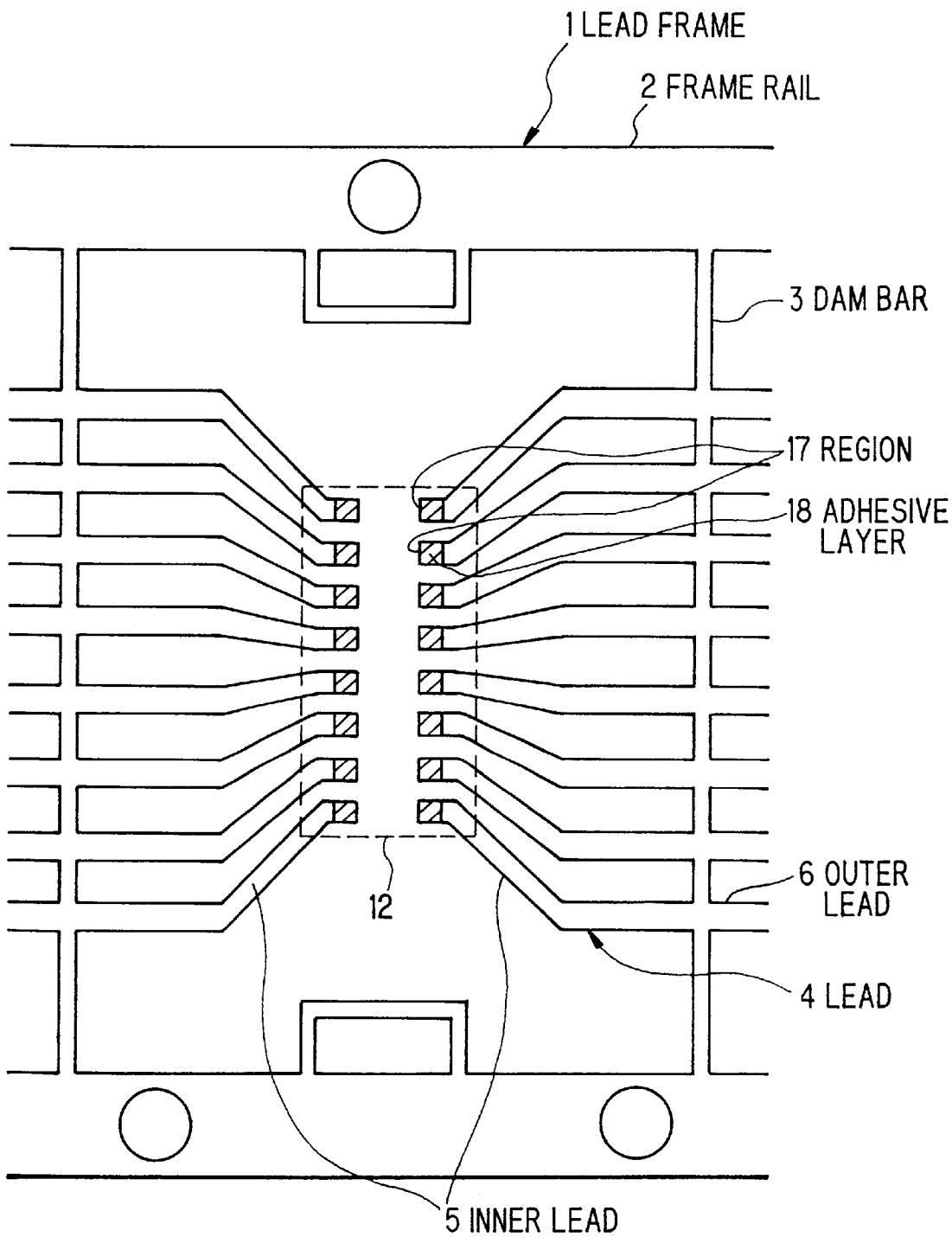
FIG. 4 is a view similar to FIG. 1, but showing a second conventional lead frame, to inner leads of which varnish-like adhesives are applied.

FIG. 4 shows the second conventional lead frame, wherein like parts are indicated by like reference numerals as used in FIGS. 1 and 2. The lead frame 1 has inner leads 5, on predetermined regions 17 of which varnish-like adhesives are applied to form adhesive layers 18.

According to the second conventional lead frame, as explained before, there are advantages in that the cost of the lead frame becomes low, and the semiconductor package may contains less quantity of moisture so that a creation of crack in the package may be avoided.

Figure 5:
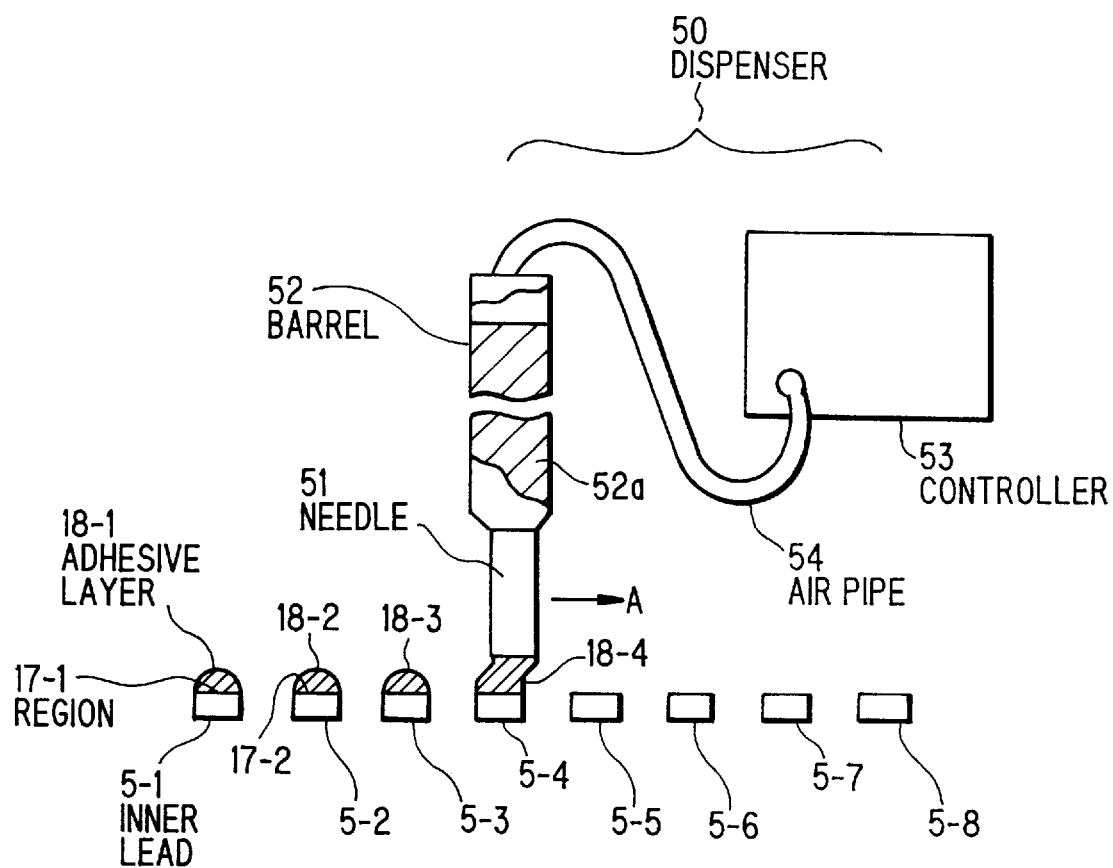
FIG. 5 is a schematic view showing a process of applying varnish-like adhesives to inner leads with a dispenser.

FIG. 5 shows a process of applying a varnish-like adhesive to inner leads of the second conventional lead frame. Although 8 inner leads 5-1~5-8 separated by a predetermined spacing with each other are shown for convenience, the number of the leads is optional. A predetermined quantity of the varnish-like adhesive is applied to a predetermined region 17-1~17-8 of each inner lead 5-1~5-8 with a dispenser 50 successively by moving in the direction indicated by arrow A, so that adhesive layers 18-1, 18-2, 18-3, 18-4 each having a semicylindrical shape are formed thereon. The varnish-like adhesive is made of thermoplastic resin or thermosetting resin dissolved in a solvent.

The dispenser 50 comprises a moving mechanism including a needle 51 and a barrel 52, and a controller 53. The barrel 52 is connected to the controller 53 with a flexible air pipe 54, which may be made of vinyl, rubber or the like. The needle 51 has a tubular structure having an inside diameter of about 0.34 mm, an outside diameter of 0.64 mm and a length of about 13 mm, and is made of stainless steel, for example. One end of the needle 51 is joined to the barrel 52 having a capacity of about 30 cc to contain a varnish-like adhesive 52a such as thermoplastic resin of polyetheramidoimide. The barrel 52 is made of polypropylene or the like. The controller 53 has circuitry and a mechanism to control a dispensing pressure and a dispensing time of the varnish-like adhesive by air which is supplied from an air pump (not shown) to the barrel 52 through the air pipe 54.

In operation, the varnish-like adhesive 52a in the barrel 52 is transferred to the needle 51 by air pressure and dispensed from an open end thereof. As the barrel 52 and the needle 51 move across the inner lead (a beginning inner lead) 5-1 in the direction indicated by arrow A in FIG. 5, the varnish-like adhesive 52a is dispensed from the needle 51 and a certain quantity of the adhesive is applied to the region 17-1 of the inner lead 5-1 to form an adhesive layer 18-1. Other adhesive layers 18-2, 18-3, 18-4 are formed in a similar way successively by moving the barrel 52 and the needle 51 in the same direction A and continuously dispensing the varnish-like adhesive 52a from the needle 51. In this case, in order to form an adhesive layer on each inner lead appropriately, other conditions such as a clearance between the needle 51 and each inner lead 5-1~5-8 and a moving rate of the needle 51 need to be optimized. Under optimum conditions, adhesive layers are formed on the inner leads without any spillover between adjacent inner leads. After the varnish-like adhesive layers 18-1~18-8 are formed on the inner lead 5-1~5-8, the solvent contained therein is evaporated by placing the inner leads on a hot plate heated at a predetermined temperature for a several minutes.

According to the second conventional lead frame, a varnish-like adhesive 52a is dispensed continuously by supplying air to the barrel 52, as the barrel 52 and the needle 53 move across the inner leads 5-1~5-8 successively. In this case, a time lag from pressurizing the barrel by air to dispensing the adhesive from the needle exists, and it depends on a quantity of the adhesive 52a contained in the barrel 52. In addition, even if the barrel stops being pressurized after an intended application of adhesive to the inner lead (an ending inner lead) 5-8, the dispensation of the adhesive will not stop simultaneously due to residual air pressure in the barrel 52. Therefore, the quantity of the adhesive applied to the beginning inner lead 5-1 and that applied to the ending inner lead 5-8 become unstable, typically more than the predetermined normal quantity thereof.

Figure 6:
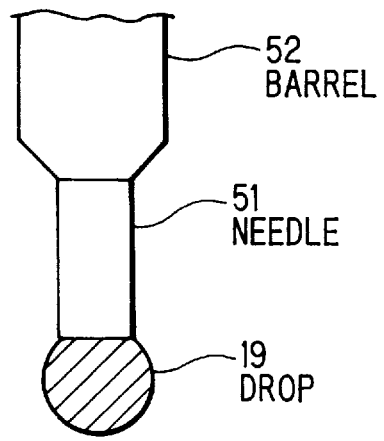
FIG. 6 is an enlarged schematic view showing a drop of varnish-like adhesive dispensed from a needle of the dispenser shown in FIG. 5, FIGS. 7A, 7B and 7C are views showing examples of inappropriate applications of varnish-like adhesives to inner leads.
Figure 7A:
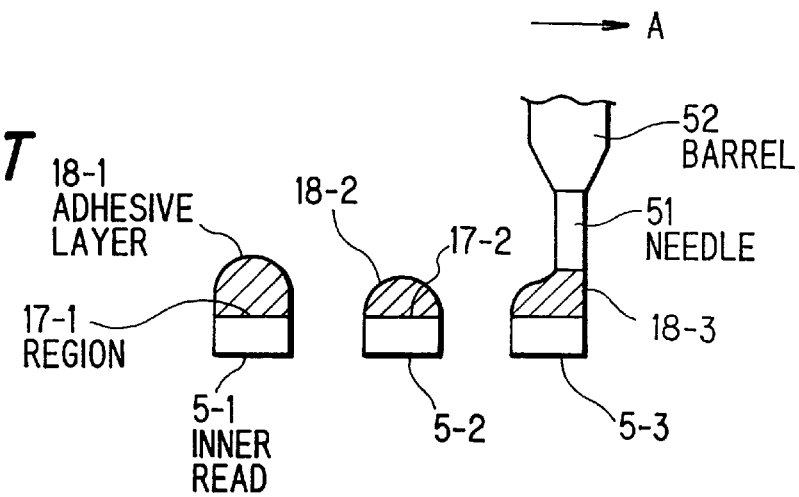

FIGS. 6, 7A, 7B and 7C show examples of inappropriate application of the varnish-like adhesive to the inner leads. Before the application of the adhesive to the inner lead 5-1 begins, a drop 19 of adhesive is created at the open end of the needle 51 due to gravity and surface tension, etc., as shown in FIG. 6. If, in addition to the drop 19, a predetermined quantity of adhesive is further dispensed from the needle 51, an excessive quantity of adhesive (which equals to sum of the quantity of the drop 19 and the predetermined normal quantity to be dispensed) is applied on a predetermined region 17-1 of the beginning inner lead 5-1, and may form a thicker adhesive layer 18-1 than the subsequent adhesive layers 18-2, 18-3 formed on the second and third inner leads (intermediate inner leads) 5-2 and 5-3, as shown in FIG. 7A. Nonuniform thickness of the adhesive layers may result in a defect in subsequent wire bonding for making a semiconductor device.

Figure 7B:
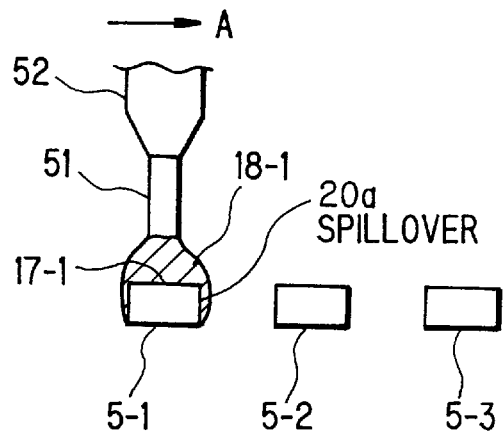
Figure 7C:
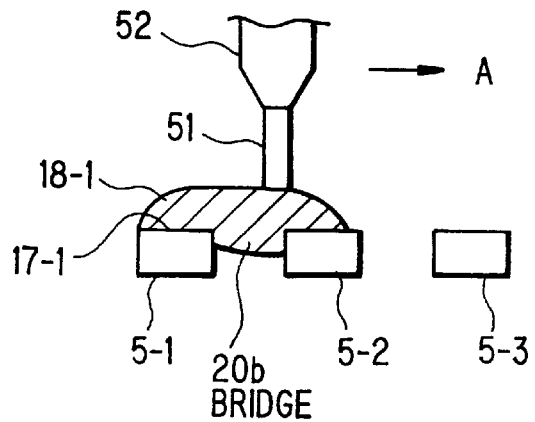

On the other hand, as shown in FIGS. 7B and 7C, when such an excessive quantity of adhesive is applied to the inner lead, a spillover 20a on both edges of the inner lead 5-1, or a bridge 20b between the adjacent inner leads 5-1 and 5-2 may be created. If the back side of the inner lead is stained with such adhesive, a wire bonding thereto may be defective.

A similar phenomenon may be observed for an adhesive layer formed on the ending inner lead, because the quantity of the varnish-like adhesive may becomes unstable, typically more than the predetermined normal quantity, due to an inertial effect of the remaining adhesive in the needle.

In sum, if the adhesive layers formed on the inner leads are not uniform in a large extent, mounting a semiconductor chip on the inner leads and wire bonding may be defective, and it may be difficult to obtain a thinner semiconductor package.

Next, a lead frame for a semiconductor device in the first preferred embodiment will be explained in FIGS. 9 and 10, wherein like parts are indicated by like reference numerals as used in FIG. 4.

Figure 8:
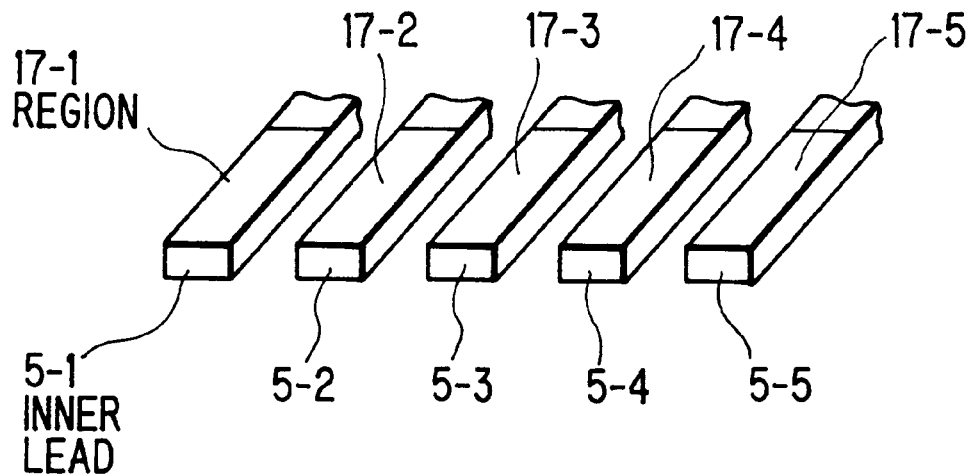
FIG. 8 is an enlarged perspective view showing inner leads of the second conventional lead frame.
Figure 9:
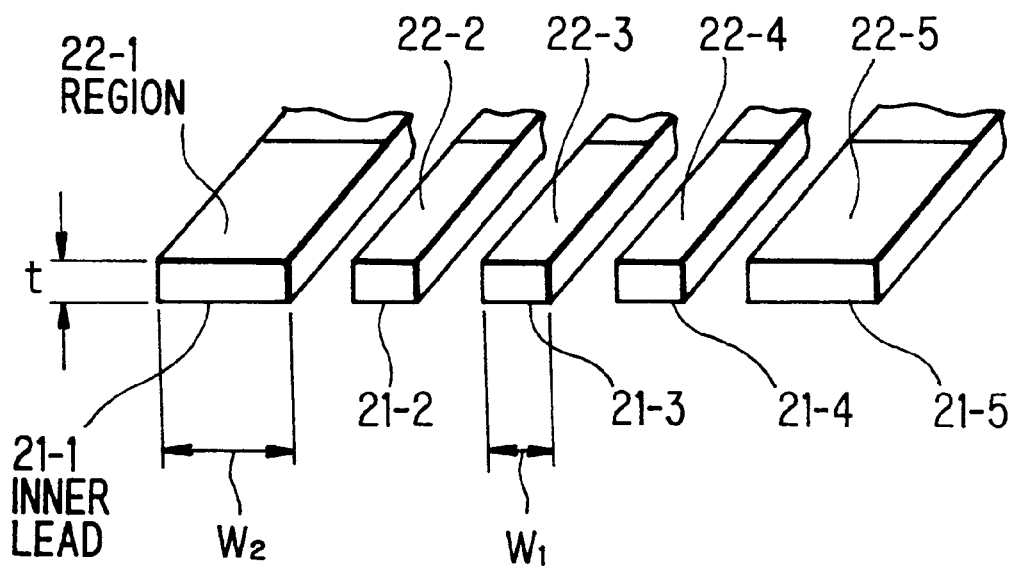
FIG. 9 is a view similar to FIG. 8, but showing inner leads of a lead frame in a first preferred embodiment according to the invention.

FIG. 9 shows main portions of inner leads of the lead frame in the first preferred embodiment, wherein only five inner leads are shown for convenience. The lead frame comprises two different kinds of inner leads, i.e., first inner leads 21-2, 21-3 and 21-4 each having a region 22-2, 22-3, 22-4 on which a predetermined quantity of adhesive is applied, and second inner leads 21-1 and 21-5 each having a region 22-1, 22-5 which is wider than those of the first inner leads. The first inner leads 21-2, 21-3 and 21-4 have a width $W_1$ which is similar to those of a conventional lead frame shown in FIG. 8, while the second inner leads 21-1 and 21-5 have a width $W_2$ which is wider than $W_1$. The second inner leads 21-1 and 21-5 are arranged at the positions where one successive application of varnish-like adhesive to the inner leads begins and ends, respectively (hereinafter referred to as a beginning inner lead 21-1 and an ending inner lead 21-5). In this case, the ratio of $W_1$ to $W_2$ is preferably 1 to 1.3 (i.e., $W_1:W_2=1:1.3$) or more. Moreover, the thickness t of the beginning and ending inner leads 21-1 and 21-5 is the same as those of other inner leads 21-2, 21-3, 21-4 (hereinafter referred to as intermediate inner leads).

Since the beginning inner lead 21-1 and the ending inner lead 21-5 are wider than the first inner leads 21-2, 21-3, and 21-4 in width (i.e., the beginning and ending inner leads 21-1 and 21-5 have a wider region 22-1 and 22-5 than those of the intermediate inner leads 21-2, 21-3, and 21-4), even if an excessive quantity of varnish-like adhesive is applied to the beginning inner lead 21-1 or the ending inner lead 21-5 due to the phenomena explained before, the applied varnish-like adhesives are spread over the regions 22-1 and 22-5, especially in the lateral directions thereof, then form appropriate adhesive layers, the thickness of which substantially equals to those of adhesive layers formed on the intermediate inner leads 21-2, 21-3 and 21-4. According to the first embodiment, the thickness differences between adhesive layers formed on inner leads, which may cause a defect in wire bonding, are minimized.

Figure 10:
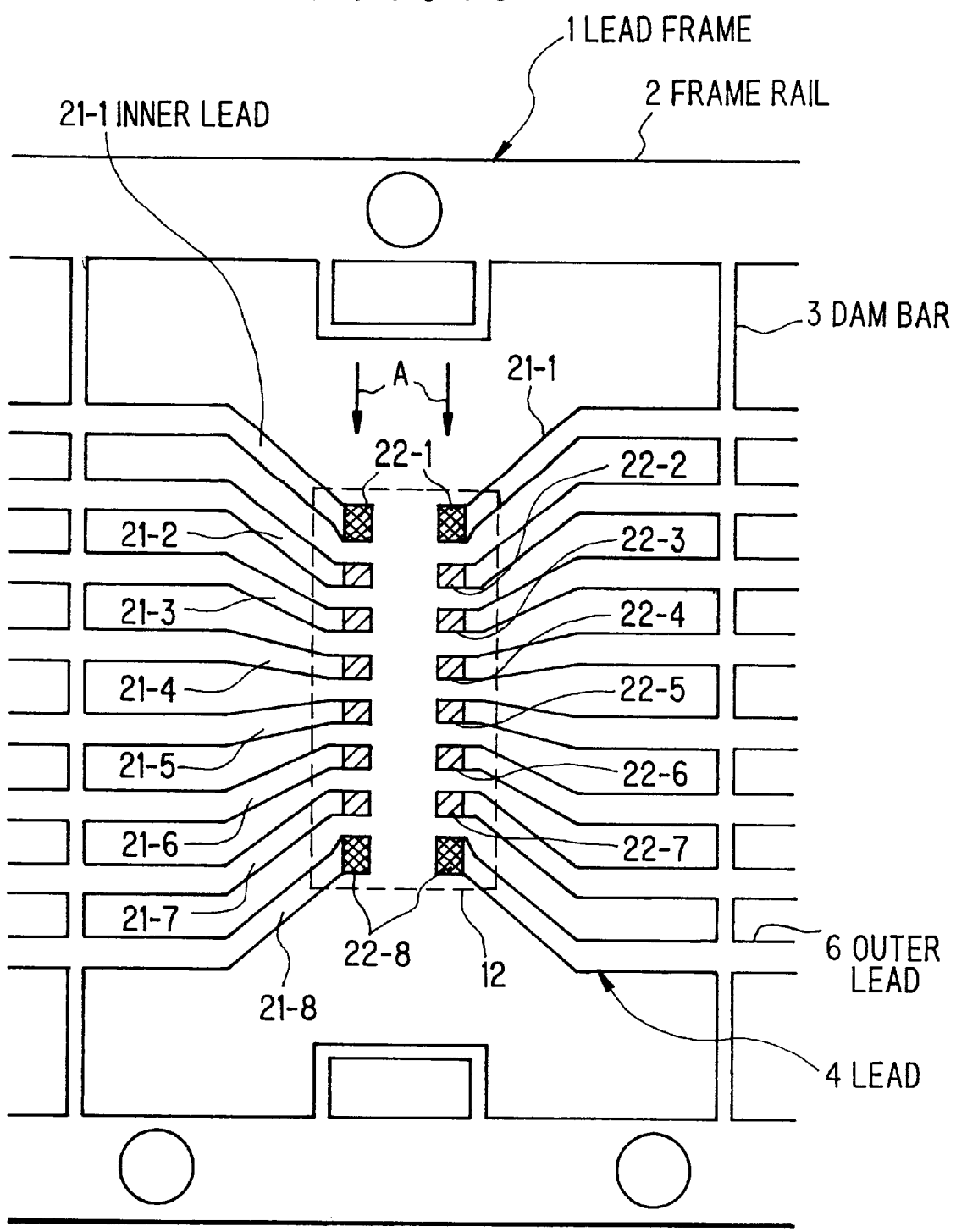
FIG. 10 is a plane view showing the lead frame in a second preferred embodiment according to the invention.

FIG. 10 shows the lead frame in the second preferred embodiment according to the invention, wherein like parts are indicated by like reference numerals as used in FIGS. 4 and 9. The lead frame 1 has eight leads 4 for convenience, which comprises intermediate inner leads 21-2~21-7 each having a region 22-2~22-7 on which a predetermined quantity of adhesive is applied, and a beginning inner lead 21-1 and an ending inner lead 21-8 each having a region 22-1, 22-8 which is wider than those of the intermediate inner leads. As an application of varnish-like adhesive to each inner lead proceeds in the direction indicated by arrow A, the wider region 22-1 of the beginning inner leads 21-1 where the application begins can receive an excessive quantity of adhesive, and the region 22-8 of the ending inner lead 21-8 where the application ends can receive an excessive quantity of adhesive.

Actual examples of lead frames in accordance with the invention together with those of the conventional lead frame are demonstrated by the inventors and will be explained below.

A metallic plate of Fe-42%Ni alloy having thickness t of 0.15 mm is etched to form two types of lead frames. One is a conventional lead frame such as shown in FIG. 8 (hereinafter referred to as "EXAMPLE 1"), and another is a lead frame in accordance with the invention such as shown in FIG. 9 (hereinafter referred to as "EXAMPLE 2"). Each lead frame has the same spacing of 0.3 mm between adjacent inner leads. Although FIGS. 8 and 9 only shows five leads, the actual examples have about 20~80 leads in one piece.

Each inner lead of EXAMPLE 1 has a width of 0.3 mm, and each intermediate inner lead of EXAMPLE 2 has the same width as those of EXAMPLE 1 (0.3 mm), while each beginning inner lead of EXAMPLE 2 where an application of varnish-like adhesive begins and each ending inner lead thereof where an application thereof ends have a width of 0.5 mm.

A varnish-like adhesive is applied to the inner leads of each lead frame with the dispenser 50 shown in FIG. 5. The varnish-like adhesive contains thermoplastic resin of polyetheramidoimide, coefficient of viscosity of which is about 100 Pa·s at 25° C. and a solid portion of which is about 20 wt %. The varnish-like adhesive is filled in the barrel 52 having a capacity of about 30 cc, and sealed. As the needle 51 is moved across the inner leads successively (without being paused even above the spacing between adjacent inner leads), the varnish-like adhesive is dispensed from the needle 51 continuously. The pressure for the dispensation is 3.5 kg/cm$^2$, the moving rate of the needle is 10 mm/s, and the distance between the tip (open end) of the needle and the inner leads is 0.15 mm. These conditions are determined so as to form adhesive layers of 30 μm thickness after evaporating a solvent contained therein. Therefore, these conditions may change depending on a desired thickness of the adhesive layers. After the varnish-like adhesive is applied to each inner lead, the solvent contained therein is evaporated by three stages of hot plates, the temperatures of which are 100° C., 200° C. and 300° C., respectively. Each lead frame having the inner lead on which the adhesive layer is formed is conveyed on the hot plates of 100° C., 200° C. and 300° C. successively in order and heated for 5 minutes each.

In accordance with the process explained above, 100 pieces of lead frames of EXAMPLE 1 and EXAMPLE 2 to which varnish-like adhesives are applied are made, respectively, and thickness of adhesive layers of each lead frame thus formed are measured. The measuring is performed by using a commercially available focal microscope (which is capable of detecting a distance of up to 0.1 μm) to obtain the distance between the surface of each adhesive layer and the surface of the inner lead in the vicinity of the adhesive layer (i.e., the thickness of each adhesive layer). The results of the measuring are shown in TABLE 1 and TABLE 2 for EXAMPLE 1 and EXAMPLE 2, respectively.

TABLE 1

| EXAMPLE 1 (PRIOR ART) | MINIMUM THICKNESS | AVERAGE THICKNESS | MAXIMUM THICKNESS |
| --- | --- | --- | --- |
| BEGINNING INNER LEAD | 35.9 μm | 40.5 μm | 52.2 μm |
| INTERMEDIATE INNER LEADS | 29.0 μm | 30.5 μm | 31.7 μm |
| ENDING INNER LEAD | 38.9 μm | 43.1 μm | 55.6 μm |

According to the conventional lead frame of EXAMPLE 1, a minimum thickness difference is 9.94 μm (38.9 μm−29.0 μm=9.9 μm), and an average thickness difference and a maximum thickness difference are 12.6 μm (43.1 μm−30.5 μm=12.6 μm) and 23.9 μm (55.6 μm−31.7 μm=23.9 μm), respectively. Thus, substantial thickness differences of adhesive layers are observed.

TABLE 2

| EXAMPLE 2 (INVENTION) | MINIMUM THICKNESS | AVERAGE THICKNESS | MAXIMUM THICKNESS |
| --- | --- | --- | --- |
| BEGINNING INNER LEAD | 29.4 μm | 30.5 μm | 32.7 μm |
| INTERMEDIATE INNER LEADS | 28.9 μm | 31.0 μm | 31.6 μm |
| ENDING INNER LEAD | 30.1 μm | 31.3 μm | 32.9 μm |

On the other hand, according to the lead frame of EXAMPLE 2 in accordance with the invention, a minimum thickness difference is 1.2 μm (30.1 μm−28.9 μm=1.2 μm), and an average thickness difference and a maximum thickness difference are 0.8 μm (31.3 μm−30.5 μm=0.8 μm) and 1.3 μm (32.9 μm−31.6 μm=1.3 μm), respectively. Thus, thickness differences of adhesive layers become minimum.

Next, a lead frame in a third preferred embodiment according to the invention will be explained in FIG. 11, wherein like parts are indicated by like reference numerals as used in FIG. 10.

The lead frame 1 includes inner leads 21-1~21-8 each having a region 22-1~22-8 on which a predetermined quantity of varnish-like adhesive is applied, and three secondary leads 23-1, 23-2, and 23-3 each having a region 24-1, 24-2, 24-3 on which an unstable quantity of adhesive is applied. The secondary leads 23-1 and 23-3 are located on both sides of the series of inner leads 21-1~21-8 in parallel, i.e., at the positions where one successive application of varnish-like adhesive begins and ends in the direction as indicated by arrow A in FIG. 11, respectively. The secondary leads 23-1 and 23-3 are branch off from the inner leads 21-1 and 21-8, respectively, regions 24-1 and 24-3 of which are twice wider than those 22-1~22-8 of the inner lead 21-1~21-8.

On the other hand, the secondary lead 23-2 is located in the middle of the series of inner leads 21-1~21-8, one end of which is joined to the inner lead 21-4 and branched off therefrom, a region 24-2 of which has the same area as those of the inner leads 21-1~21-8.

Each spacing between adjacent inner leads or between the secondary lead and its adjacent inner lead are the same. Moreover, all regions 22-1~22-8, 24-1~24-3 are located inside an area 12 in which a semiconductor chip (not shown) is later to be placed.

A thermoplastic insulating adhesive having a glass transition temperature of 220° C. is dissolved with a solvent to obtain a varnish-like adhesive. The varnish-like adhesive is applied to the lead frame by a similar dispenser in a similar way to those in aforementioned preferred embodiments. First of all, a needle of the dispenser where the varnish-like adhesive is dispensed is positioned on the region 24-1 of the secondary lead 23-1, from which the application of the varnish-like adhesive begins. When the application begins, a barrel which contains the varnish-like adhesive is pressurized by air. Because there is a time lag of actual dispensation from the time of pressurizing the barrel, an unstable quantity of adhesive is dispensed from the needle at the beginning. According to the third preferred embodiment, such unstable quantity of adhesive is received by the region 24-1 of the secondary inner lead 23-1. In this case, since the area of the region 24-1 thereof is twice wider than those of the regions 22-1~22-8 of the inner leads 21-1~21-8, the region 24-1 is wide enough to receive the unstable quantity of adhesive which may depend on a changeable time lag of dispensation due to a remaining volume of the adhesive contained in the barrel. As the needle of the dispenser is moved toward the inner lead 21-1 at a constant rate, the quantity of adhesive dispensed from the needle becomes stable and a predetermined quantity of adhesive is applied to the region 22-1 of inner lead 21-1, the region 22-2 of the inner lead 21-2, and so forth, to form uniform adhesive layers thereon.

In the third preferred embodiment, the application of adhesive ends at the secondary lead 23-3. When the needle of the dispenser is moved above the region 24-3 of the secondary lead 23-3, the barrel is released from pressure. Although a remaining air pressure keeps the adhesive being dispensed and an unstable quantity of adhesive is dispensed until the dispensation finally ends, the region 24-3 of the secondary lead 23-3 receives such adhesive. The region 24-3 is wide enough to receive the unstable quantity of adhesive which may depend on a changeable time lag of dispensation due to a remaining volume of the adhesive contained in the barrel. Moreover, the secondary lead 23-3 also receives a residual adhesive, which otherwise may develop into a drop of adhesive and become a problem with an application of adhesive to the next lead frame.

In the third preferred embodiment, another secondary lead 23-2 is provided in the middle of the series of inner leads 21-1~21-8. The secondary lead 23-2 also receives a possible unstable quantity of adhesive which may be dispensed in the course of one successive application. Therefore, uniform adhesive layers formed on the inner leads 21-4 and 21-5 adjacent to the secondary lead 23-2 are ensured.

For making a semiconductor device by using the lead frame in the third preferred embodiment according to the invention, a semiconductor chip is mounted on the inner leads and the secondary leads through the adhesive layers. Contact pads on the semiconductor chip are electrically connected to the corresponding inner leads by bonding wires, respectively, while the secondary leads are not electrically connected to the semiconductor chip. Finally, the inner leads, the secondary leads, and the bonding wires are covered by a molding resin to form a semiconductor device.

According to the third preferred embodiment, the secondary leads are similar to the inner leads in shape and branched off from the adjacent inner leads, however, they are not limited to such particular shapes or structures. The secondary leads may have a variety of shapes as far as they are capable of receiving unstable quantities of adhesives. Moreover, the secondary leads may be directly extended from a frame rail or a dam bar of the lead frame.

Arrangement of secondary leads in the lead frame in accordance with the invention may be modified as explained below but modifications are not limited to these embodiments.

Figure 11:
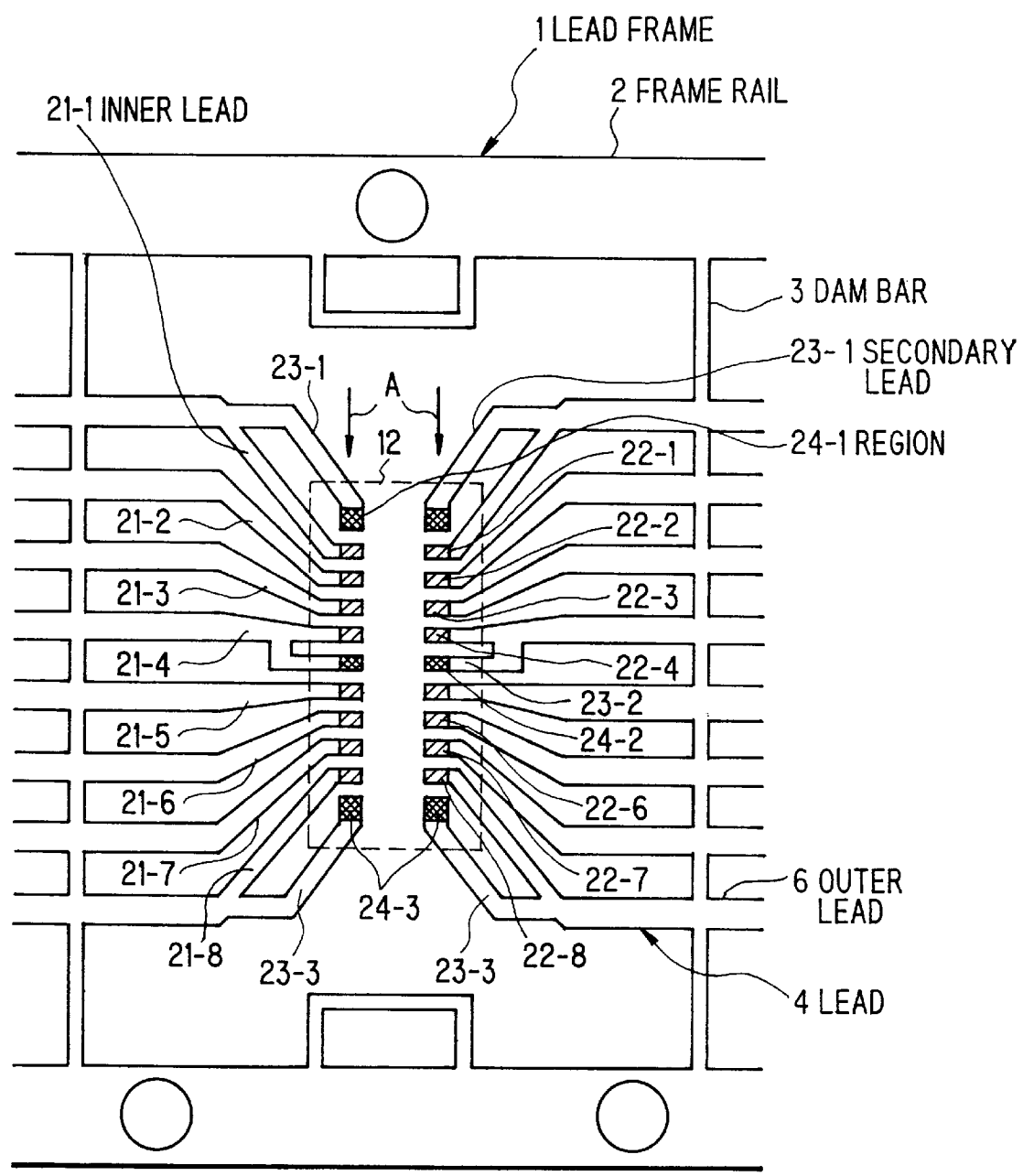
FIG. 11 is a view similar to FIG. 10, but showing a lead frame in a third preferred embodiment according to the invention.
Figure 12:
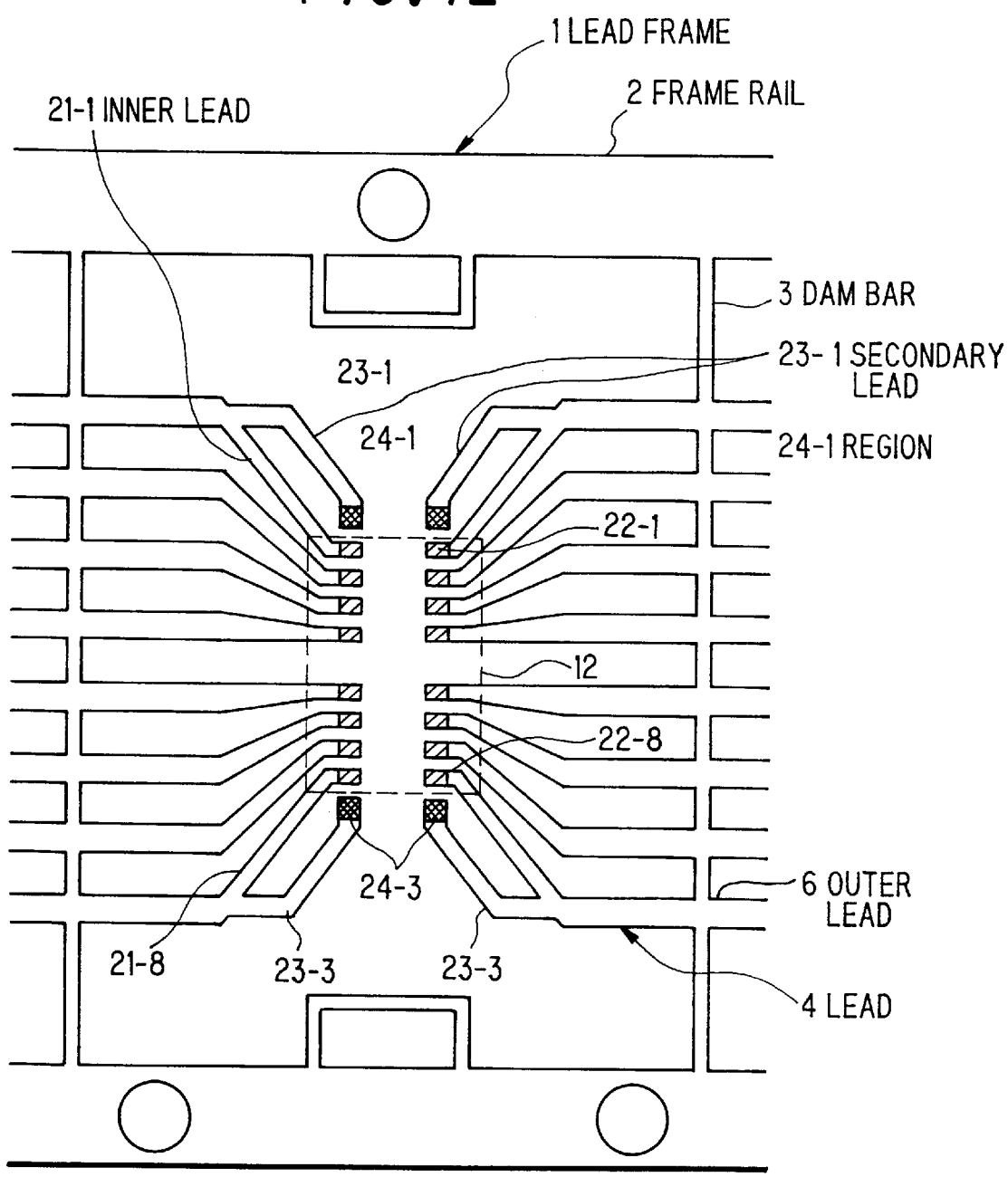
FIG. 12 is a view similar to FIG. 10, but showing a lead frame in a fourth preferred embodiment according to the invention.

FIG. 12 shows a lead frame in the fourth preferred embodiment according to the invention, wherein like parts are indicated by like reference numerals as used in FIG. 11. In the embodiment, only secondary leads 23-1 and 23-3 which receive an unstable quantity of adhesive are positioned outside a region 12 where a semiconductor chip is mounted.

Figure 13:
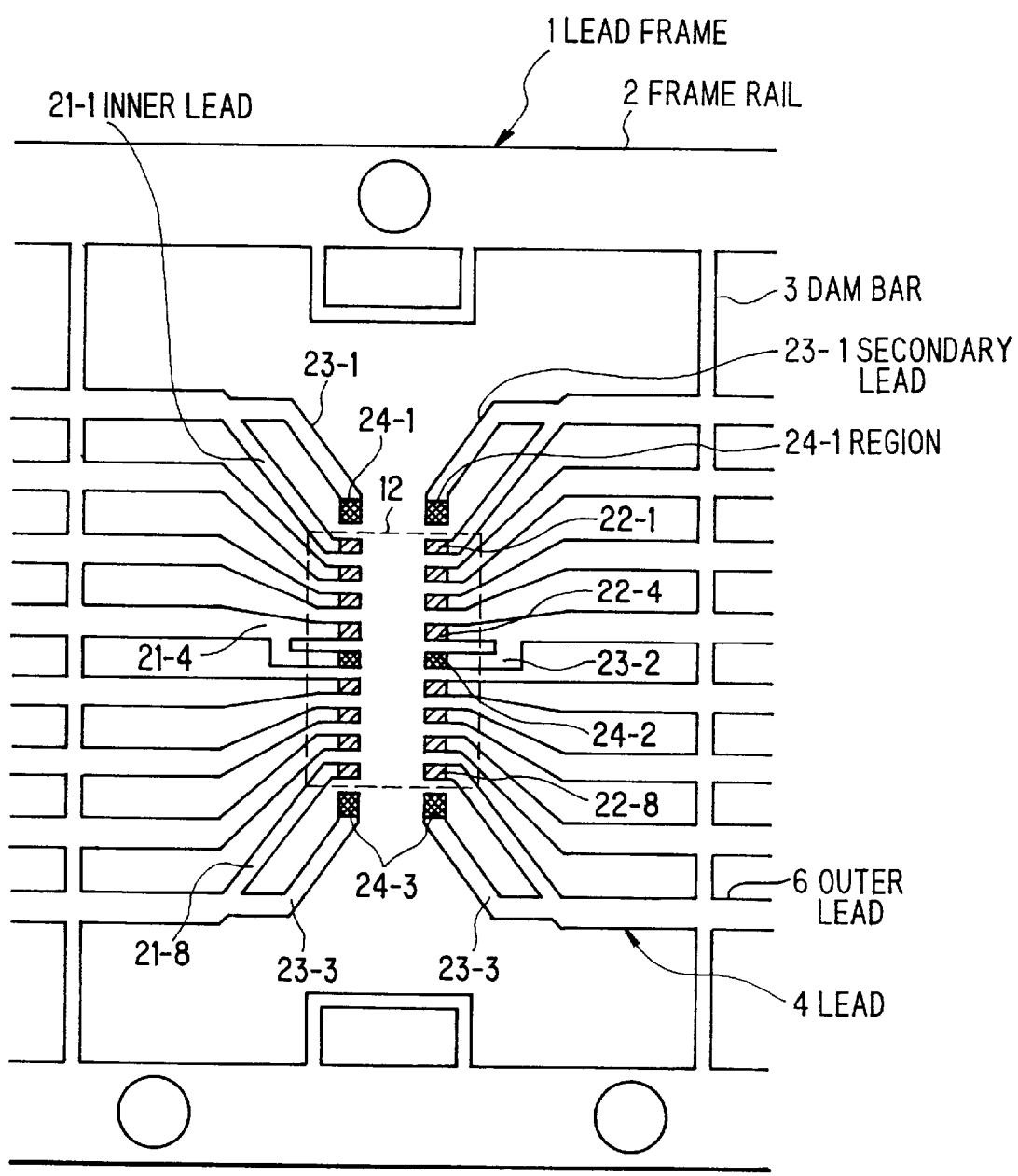
FIG. 13 is a view similar to FIG. 10, but showing a lead frame in a fifth preferred embodiment according to the invention.

FIG. 13 shows a lead frame in the fifth preferred embodiment according to the invention, wherein like parts are indicated by like reference numerals as used in FIG. 11. The lead frame is similar to that shown in FIG. 11, but secondary leads 23-1 and 23-3 which receive an unstable quantity of adhesive are positioned outside a region 12 where a semiconductor chip is mounted, while another secondary lead 23-2 is positioned in the middle of the series of inner leads 21-1~21-8.

Figure 14:
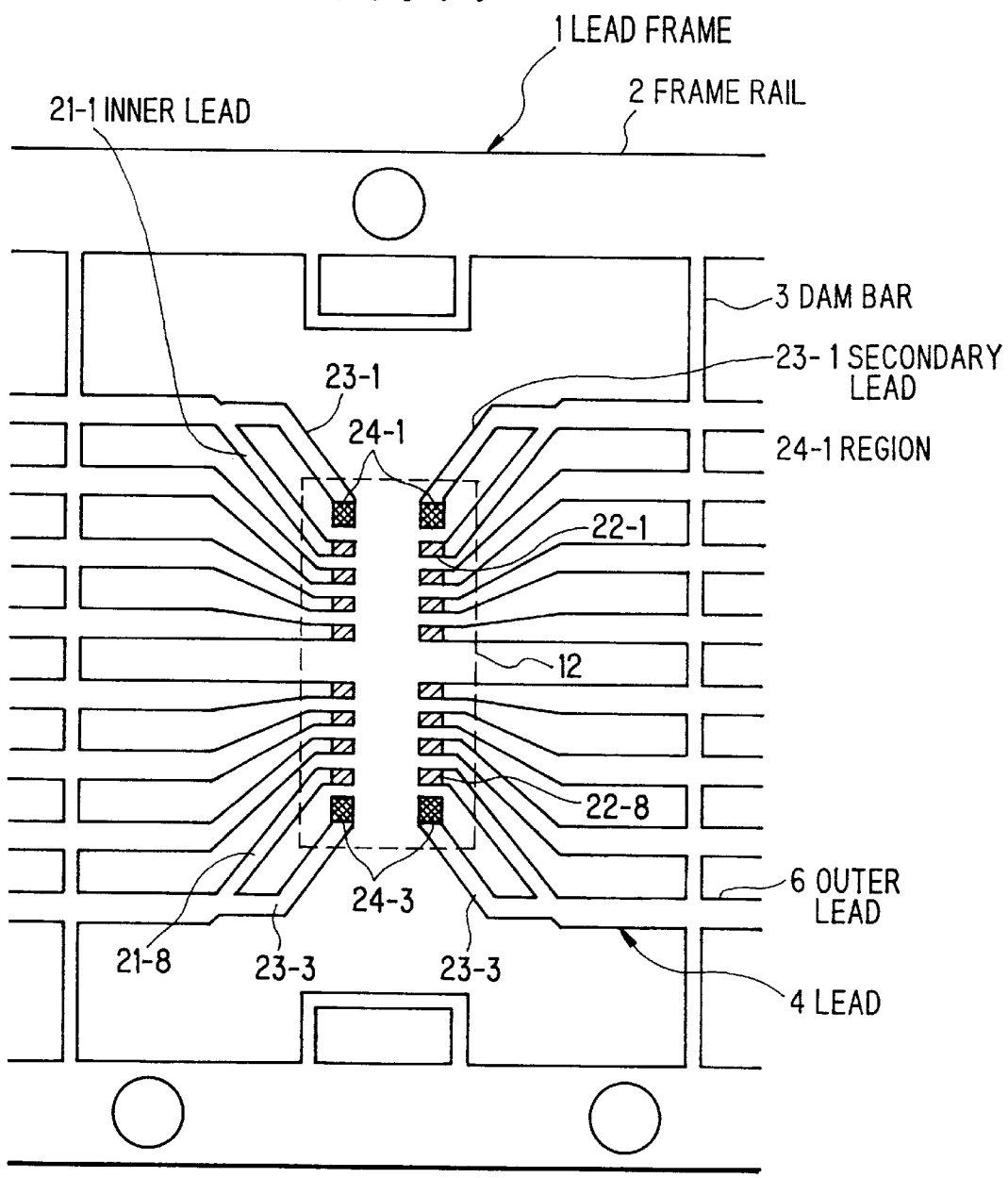
FIG. 14 is a view similar to FIG. 10, but showing a lead frame in a sixth preferred embodiment according to the invention.

FIG. 14 shows a lead frame in the sixth preferred embodiment according to the invention, wherein like parts are indicated by like reference numerals as used in FIG. 11. In the embodiment, only secondary leads 23-1 and 23-3, which receive an unstable quantity of adhesive, respectively, are positioned inside a region 12 where a semiconductor chip is mounted.

Figure 15:
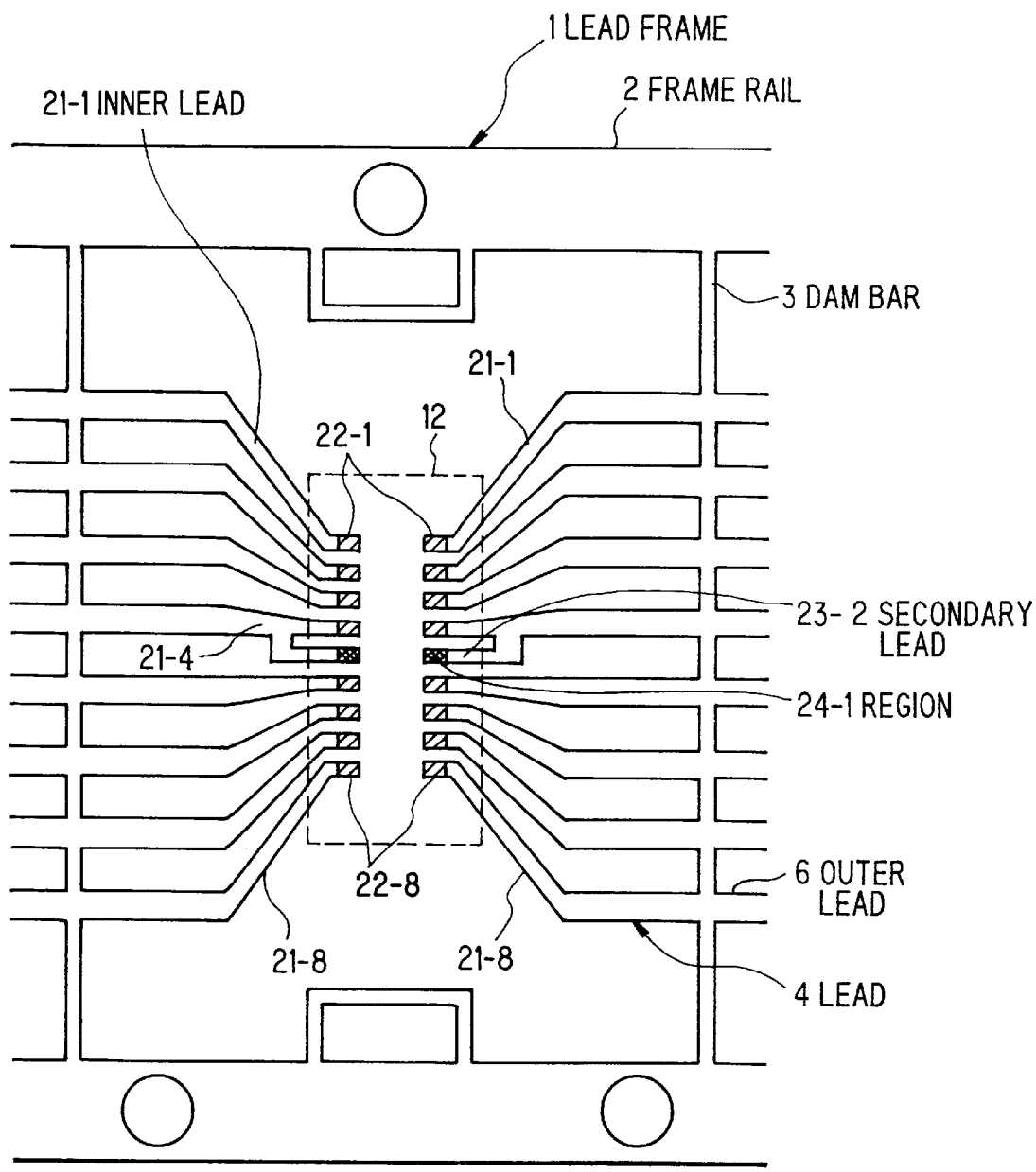
FIG. 15 is a view similar to FIG. 10, but showing a lead frame in a seventh preferred embodiment according to the invention.

FIG. 15 shows a lead frame in the seventh preferred embodiment according to the invention, wherein like parts are indicated by like reference numerals as used in FIG. 11. In the embodiment, only a secondary lead 23-2 is positioned in the middle of the series of inner leads 21-1~21-8 to receive an unstable quantity of adhesive.

In the above mentioned preferred embodiments, a varnish-like adhesive may contain fillers such as $SiO_2$, silicone resin or the like so as to obtain sufficient thickness of adhesive layers. Furthermore, in order to more efficiently apply varnish-like adhesives to leads, the adhesives may be applied to a pair of inner leads arranged on the right and left simultaneously, with a multiple-needle dispenser, or a multiple-head dispenser.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A lead frame for a semiconductor device, said lead frame having a plurality of leads, each said lead having a region on which an insulative adhesive is applied so that a semiconductor chip is to be attached to said leads with said insulative adhesives, said leads comprising:

a plurality of first leads having a region on which a predetermined quantity of insulative adhesive is applied successively; and a second lead having a region on which an unstable quantity of insulative adhesive is received.

2. A lead frame for a semiconductor device according to claim 1 wherein the insulative adhesive is a thermoplastic material dissolved in solvent.

3. A lead frame for a semiconductor device, said lead frame having a plurality of leads, each said lead having a region on which an insulative adhesive is applied so that a semiconductor chip is to be attached to said leads with said insulative adhesives, said leads comprising:

a plurality of first inner leads having a region on which a predetermined quantity of insulative adhesive is applied successively; and a second lead having a region which is wider than that of said first inner leads so that an unstable quantity of insulative adhesive is received thereon.

4. A lead frame for a semiconductor, according to claim 3, wherein:

said second lead is provided at a position where said application of said adhesive begins.

5. A lead frame for a semiconductor, according to claim 3, wherein:

said second lead is provided at a position where said application of said adhesive ends.

6. A lead frame for a semiconductor, according to claim 3, herein:

said second lead is provided at positions where said application of said adhesive begins and ends, respectively.

7. A lead frame for a semiconductor device, said lead frame having a plurality of leads, each said lead having a region on which an adhesive is applied so that a semiconductor chip is to be attached to said leads with said adhesives, said leads comprising:

a plurality of first inner leads having a region on which a predetermined quantity of adhesive is applied successively; and a second lead having a region which is wider than that of said first inner leads so that an unstable quantity of adhesive is received thereon, wherein said region of said second lead is more than 1.3 times wider from side to side than that of said first lead.

8. A lead frame for a semiconductor device according to claim 3 wherein the insulative adhesive is a thermoplastic material dissolved in solvent.

9. A lead frame for a semiconductor device, said lead frame having a plurality of leads, each said leads having a region on which an insulative adhesive is applied successively so that a semiconductor chip is to be attached to said leads with said insulative adhesives, said leads comprising:

a plurality of leads on which a predetermined quantity of insulative adhesive is applied; and means for receiving an unstable quantity of insulative adhesive;

wherein said receiving means is a secondary lead, one end of which is joined to one of said leads.

10. A lead frame for a semiconductor device, according to claim 9, wherein:

said secondary lead is provided inside an area in which said semiconductor chip is to be placed.

11. A lead frame for a semiconductor device, said lead frame having a plurality of leads, each said leads having a region on which an adhesive is applied successively so that a semiconductor chip is to be attached to said leads with said adhesives, said leads comprising:

a plurality of leads on which a predetermined quantity of adhesive is applied; and means for receiving an unstable quantity of adhesive, wherein said receiving means is a secondary lead, one end of which is joined to one of said leads, and wherein said secondary lead is provided outside an area in which said semiconductor chip is to be placed.

12. A lead frame for a semiconductor, according to claim 9, wherein:

said receiving means is provided at a position where said application of said adhesive begins.

13. A lead frame for a semiconductor, according to claim 9, wherein:

said receiving means is provided at a position where said application of said adhesive ends.

14. A lead frame for a semiconductor, according to claim 9, wherein:

said receiving means is provided at positions where said application of said adhesive begins and ends.

15. A lead frame for a semiconductor device according to claim 9 wherein the insulative adhesive is a thermoplastic material dissolved in solvent.

16. A semiconductor device, comprising:

a lead frame comprising a plurality of leads, each said lead having a region on which a predetermined quantity of insulative adhesive is applied successively, and means for receiving an unstable amount of insulative adhesive;

a semiconductor chip having a plurality of contact pads, each said lead of said lead frame being attached to said semiconductor chip with said insulative adhesives, said plurality of contact pads being electrically connected to corresponding leads, respectively; and a sealing resin for covering said regions of said leads, said receiving means, and said semiconductor chip;

wherein said receiving means is a secondary lead, one end of which is joined to said leads.

17. A semiconductor device, according to claim 16, wherein:

said secondary lead is provided inside an area in which said semiconductor chip is to be placed.

18. A semiconductor device, according to claim 16, wherein:

said receiving means is provided at a position where said application of said adhesive begins.

19. A semiconductor device, according to claim 16, wherein:

said receiving means is provided at a position where said application of said adhesive ends.

20. A semiconductor device, according to claim 16, wherein:

said receiving means are provided at positions where said application of said adhesive begins and ends.

21. A semiconductor device according to claim 16 wherein the insulative adhesive is a thermoplastic material dissolved in solvent.

22. A semiconductor device, comprising:
- a lead frame comprising a plurality of leads, each said lead having a region on which a predetermined quantity of adhesive is applied successively, and means for receiving an unstable amount of adhesive;
- a semiconductor chip having a plurality of contact pads, each said lead of said lead frame being attached to said semiconductor chip with said adhesives, said plurality of contact pads being electrically connected to corresponding leads, respectively; and
- a sealing resin for covering said regions of said leads, said receiving means, and said semiconductor chip,
- wherein said receiving means is a secondary lead, one end of which is joined to one of said leads, and
- wherein said secondary lead is provided outside an area in which said semiconductor chip is to be placed.

* * * * *

UNITED STATES PATENT AND TRADEMARK OFFICE
CERTIFICATE OF CORRECTION

PATENT NO. : 6,107,675
DATED : August 22, 2000
INVENTOR(S) : HIROSHI SUGIMOTO, et al.

It is certified that error appears in the above-identified patent and that said Letter Patent is hereby corrected as shown below:

On the Title page:

Section [54], amend the Title to read --LEAD FRAME, METHOD OF MAKING THE SAME, AND SEMICONDUCTOR DEVICE USING THE SAME--.

Signed and Sealed this

Twenty-seventh Day of March, 2001

*Attest:*

NICHOLAS P. GODICI

*Attesting Officer*    Acting Director of the United States Patent and Trademark Office